United States Patent
Mogilevski

(10) Patent No.: US 8,611,104 B1
(45) Date of Patent: Dec. 17, 2013

(54) MODULAR POWER SUPPLY INTERCONNECTION SYSTEM WITH PLUGGABLE INTERFACE

(75) Inventor: Igor Mogilevski, Northridge, CA (US)

(73) Assignee: Power-One, Inc., Camarillo, CA (US)

( * ) Notice: Subject to any disclaimer, the term of this patent is extended or adjusted under 35 U.S.C. 154(b) by 310 days.

(21) Appl. No.: 12/905,707

(22) Filed: Oct. 15, 2010

Related U.S. Application Data

(60) Provisional application No. 61/252,070, filed on Oct. 15, 2009.

(51) Int. Cl.
*H05K 7/20* (2006.01)
(52) U.S. Cl.
USPC ............... 361/807; 361/696.5; 361/679.1
(58) Field of Classification Search
USPC ................... 361/803, 696, 687, 688
See application file for complete search history.

(56) References Cited

U.S. PATENT DOCUMENTS

| | | | |
|---|---|---|---|
| 5,311,397 A | 5/1994 | Harshberger et al. | |
| 6,046,921 A | 4/2000 | Tracewell et al. | |
| 7,382,624 B2 | 6/2008 | Barsun et al. | |
| 7,534,148 B2 | 5/2009 | Schuttler et al. | |
| 7,542,268 B2 | 6/2009 | Johnson, Jr. | |
| 7,907,416 B2 * | 3/2011 | He et al. | 361/756 |
| 8,248,771 B2 * | 8/2012 | Chang | 361/679.02 |
| 2007/0037420 A1 | 2/2007 | Ohman | |

* cited by examiner

*Primary Examiner* — Timothy Thompson
*Assistant Examiner* — Andargie M Aychillhum
(74) *Attorney, Agent, or Firm* — Waddey Patterson; Mark J. Patterson; Gary L. Montle

(57) ABSTRACT

A switch-mode modular power supply is provided with pluggable output connectors for improved safety and simplicity of installation. The power supply has a box-shaped housing with a first end and an opposing second end. A plurality of output modules are positioned proximate the second end of the housing, with each output module having an output connector with a connector housing and a plurality of pluggable contact terminals. The output connectors are arranged in parallel across the second end of the housing and accessible from outside of the housing. The pluggable contact terminals for each of the output connectors are effective to provide an output power from the associated output module.

12 Claims, 5 Drawing Sheets

MODULAR POWER SUPPLY INTERCONNECTION SYSTEM WITH PLUGGABLE INTERFACE

CROSS-REFERENCES TO RELATED APPLICATIONS

This application claims benefit of the following patent application(s) which is/are hereby incorporated by reference: U.S. Provisional Application No. 61/252,070, filed on Oct. 15, 2009.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND OF THE INVENTION

The present invention relates generally to switch mode power supplies. More particularly, the present invention relates to a modular power supply architecture having a pluggable interface and methods of installation with regards to the same.

With reference to a conventional modular power supply such as shown in FIG. 1, terminal blocks or BUS-BAR interconnects have typically been used for input and output power terminals. Such interconnection systems require substantial time and effort for an operator to configure and connect the modular power supply to the end system. In some high density systems it is possible that shorting of the output terminal may occur as a result of, for example, mis-wiring by the operator.

It would be desirable therefore to provide a modular power supply with a simplified interconnect system that would reduce installation time and further reduce potential hazards which may result from operator error.

BRIEF SUMMARY OF THE INVENTION

In accordance with an aspect of the present invention, a modular power supply is provided with an interconnect system using pluggable connectors for both power inputs and outputs as well as signal interfacing. The modular power supply is effectively connectable to an end system is a substantially reduced amount of time and without requiring any tools or hardware of any kind.

Briefly stated, in an embodiment a switch-mode modular power supply is provided with pluggable output connectors for improved safety and simplicity of installation. The power supply has a box-shaped housing with a first end and an opposing second end. A plurality of output modules are positioned proximate the second end of the housing, with each output module having an output connector with a connector housing and a plurality of pluggable contact terminals. The output connectors are arranged in parallel across the second end of the housing and accessible from outside of the housing, and the pluggable contact terminals for each of the output connectors are effective to provide an output power from the associated output module.

In another embodiment, an output module is provided for use with a switch-mode modular power supply. A first pluggable connector for the output module has a housing and a plurality of pluggable contact terminals effective to provide output power from the output module to an external device via a cable connector configured to mate with the contact terminals of the first connector. A second pluggable connector is similarly effective to receive input power from a mother board connector which is coupled to a power bus in the modular power supply and is configured to mate with the contact terminals of the second connector. A third pluggable connector is likewise effective to receive control signals from a control board connector which is coupled to a serial communications bus in the modular power supply and configured to mate with the contact terminals of the third connector. A circuit board is electrically coupled to each of the first, second and third connectors and includes circuitry effective to convert the received input power into an output power which is determined according to the received control signals.

BRIEF DESCRIPTION OF THE SEVERAL VIEWS OF THE DRAWINGS

FIG. 5b is an isometric view of an embodiment of an external cable housing for a cable configured for coupling with the connector of FIG. 5a.

FIG. 6b is a front view of an embodiment of an external cable housing for a cable configured for coupling with the connector of FIG. 6a.

FIG. 7b is a front view of an embodiment of an external cable housing for a cable configured for coupling with the connector of FIG. 7a.

DETAILED DESCRIPTION OF THE INVENTION

Figure 1:
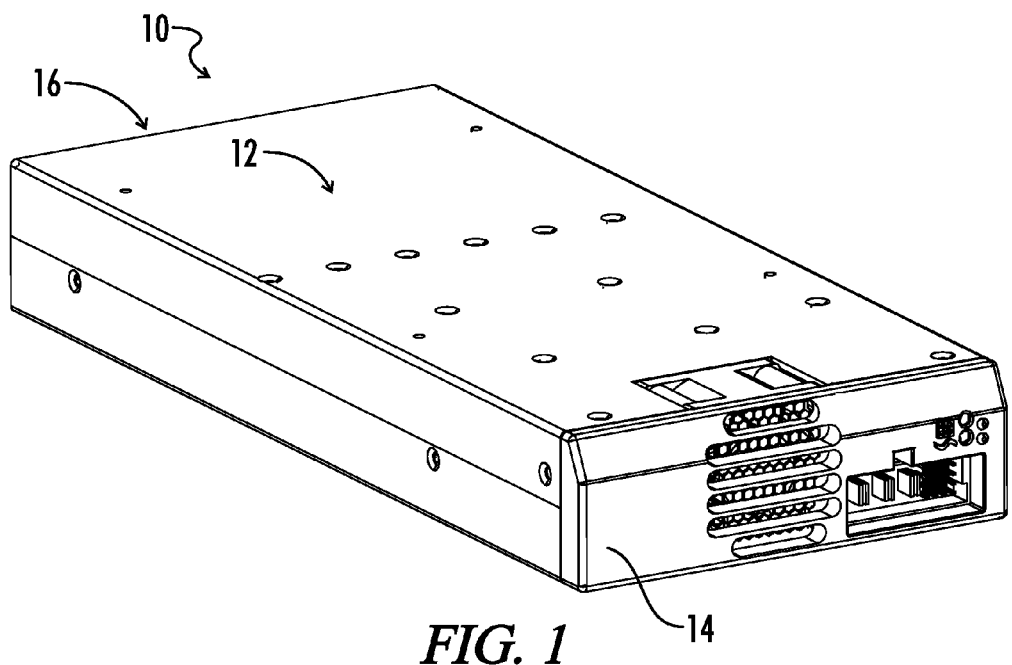
FIG. 1 is an isometric exterior view of a modular power supply in an embodiment of the present invention.
Figure 2:
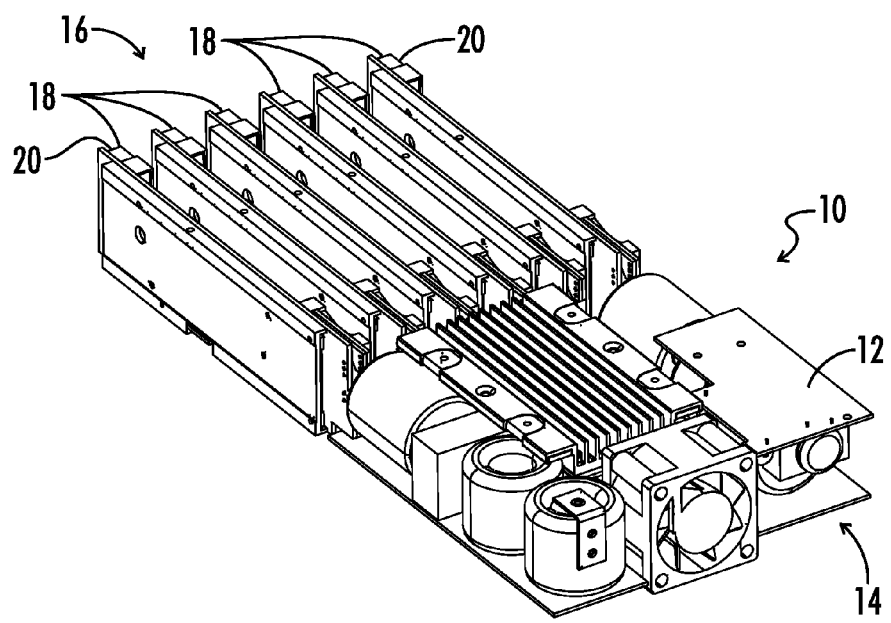
FIG. 2 is an isometric interior view of the modular power supply of FIG. 1.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices.

The terms "circuit" or "circuitry" as used herein mean at least either a single component or a multiplicity of components, either active and/or passive, that are coupled together to provide a desired function.

The term "signal" means at least one current, voltage, charge, temperature, data, digital pulse or the like.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

The term "controller" as used herein may refer to at least a general microprocessor, an application specific integrated circuit (ASIC), a digital signal processor (DSP), a microcontroller, a field programmable gate array, or various alternative blocks of discrete circuitry as known in the art, designed to perform functions as further defined herein.

Referring generally to FIGS. 1-8, various embodiments of a pluggable interconnection system for a modular power supply and methods of installing the same may be herein described. Where the various figures may describe embodiments sharing various common elements and features with other embodiments, similar elements and features are given the same reference numerals and redundant description thereof may be omitted below.

Referring to FIGS. 1-4, an embodiment of a modular power supply 10 includes a box-shaped housing 12 with four sides, a first end 14 and an opposing second end 16 to define an interior of the power supply 10. A plurality of output modules 18 are positioned in parallel with each other proximate the second end 16 of the power supply 10, whereby one or more first pluggable connectors 20 associated with each output module 18 are further arranged in parallel and may be accessible from outside of the power supply 10.

In various embodiments, the second end 16 of the power supply 10 may be substantially enclosed to define a face of the power supply 10 having a plurality of apertures through which the plurality of first pluggable connectors 20 may be accessed. In various alternative embodiments the second end 16 of the power supply 10 may be fully or partially open to permit additional access to components within the interior of the power supply 10 and further to permit increased air flow through the interior of the power supply 10.

Figure 3:
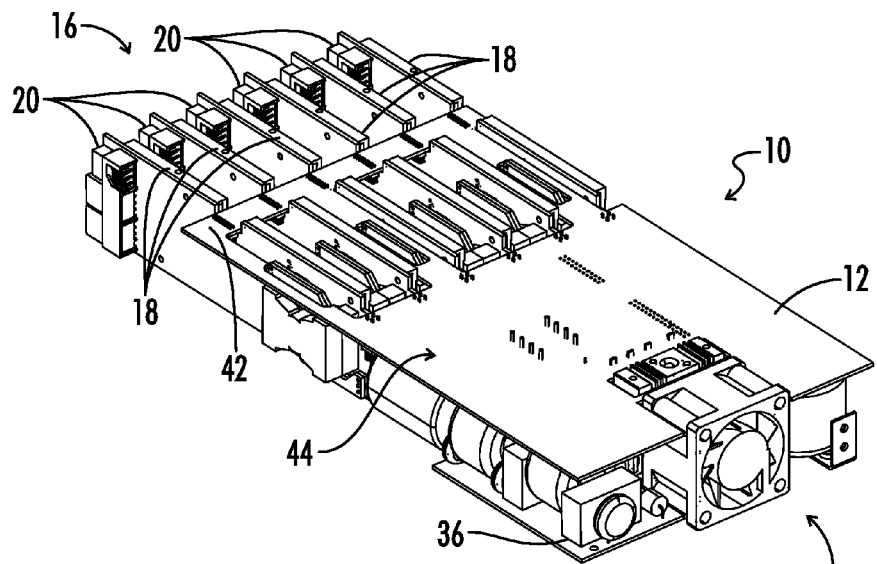
FIG. 3 is an inverted isometric interior view of the modular power supply of FIG. 1.
Figure 4:
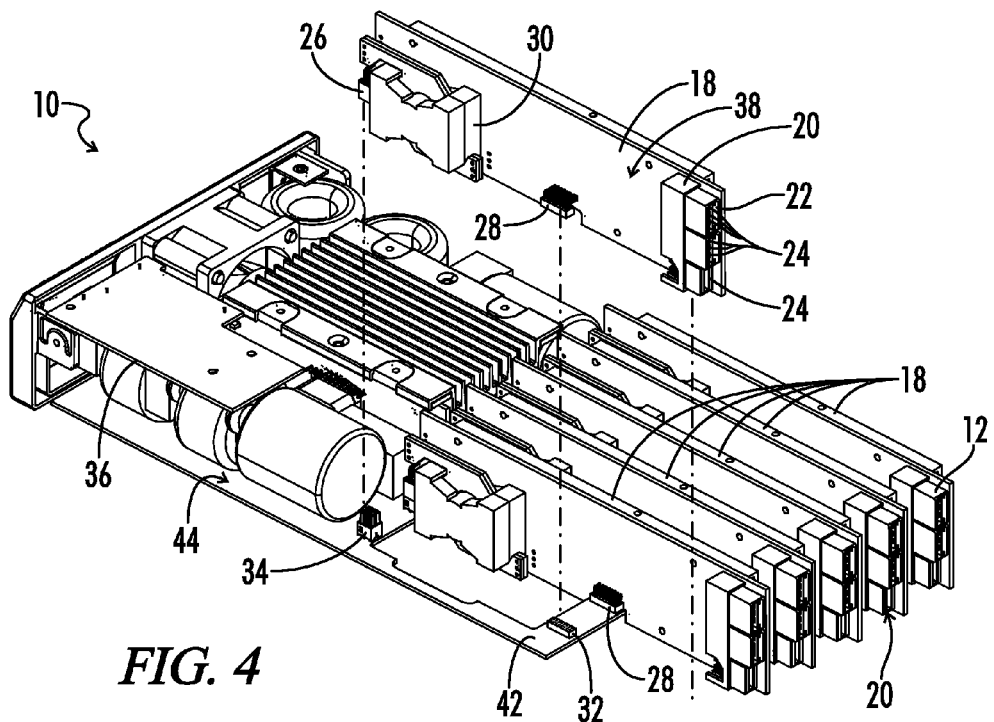
FIG. 4 is a reversed and exploded isometric interior view of the modular power supply of FIG. 1.

In an embodiment as shown generally in FIGS. 3-4, a modular power supply 10 in accordance with the present invention may have a mother board 44 upon which resides circuitry such as for example a power factor correction (PFC) controller, an intermediate power converter and intermediate power bus, and a system controller such as for example a digital power manager. A plurality of internal power connectors 34 may be provided on the mother board 44 for coupling each of the output modules 18 to the mother board 44. The connectors 34 may be surface mounted by, for example, soldering or any other equivalent method, or may be integrally formed with respect to the substrate of the mother board 44, without otherwise affecting the scope of the present invention. In various embodiments the connectors 34 may be pluggable connectors 34 such that any output module 18 may be detachably coupled to the mother board 44 as desired.

A serial communications portion 42 of the mother board 44 may be provided which interconnects, for example, the system controller to the plurality of output modules 18 via a communications medium such as for example a serial data bus. In various embodiments (not shown) the serial communications interface may alternatively be made up of a separate serial communications board coupled to the mother board 44.

A plurality of internal control connectors 32 may be provided on the serial communications portion 42 for coupling each of the output modules 18 to the serial communications portion 42. The connectors 32 may be surface mounted by, for example, soldering or any other equivalent method, or may be integrally formed with respect to the substrate of the serial communications board 42, without otherwise affecting the scope of the present invention. In various embodiments the connectors 32 may be pluggable connectors 32 such that any output module 18 may be detachably coupled to the serial communications board 42 as desired.

An EMI filter board 36 may optionally be provided as well, and in various embodiments two or more of the EMI filter board 36, the serial communications portion 42, and the mother board 44 as described herein may be combined into a single board having equivalent functionality, or may further be divided into additional boards rather than for example having a single mother board 44 with each of the above-recited circuitry.

The output modules 18 may include a second connector 26 which is configured to mate with (e.g., plug into) the internal power connector 34 previously defined with respect to the mother board 44. In various embodiments (not shown), the second connector 26 may be positioned on a first portion of the output module 18, or an output module power circuit board, which further includes a modular power transformer electrically coupled between the second connector 26 and the first connector 20. The output power from the output module 18 may therefore be galvanically isolated from the intermediate bus power provided from the intermediate power bus to each of the individual output modules 18, and each output power provided to one of various external loads may be galvanically isolated with respect to each other output power.

The output modules 18 may further, consistent with embodiments as described above, include a third connector 28 which is configured to mate with (e.g., plug in to) the control connector 32 previously defined with respect to the serial communications portion 42. In various embodiments (not shown), the third connector 28 may be positioned on a second portion of the output module 18, or an output module digital control circuit board, which may further include circuitry such as for example one or more opto-isolators for providing galvanic isolation between the third connector 28 and the first connector 20. Each output module 18 may therefore generally be galvanically isolated from the controller in the power supply and from each other output module 18 with respect to the serial communications bus.

In such embodiments (not shown), the first portion of the output module 18 may be oriented in parallel with respect to first portions of each other output module 18 across the length of the second end 16 of the power supply 10, or for example longitudinally with respect to the motherboard 44 of the power supply 10. The second portion may be coupled parallel to the first portion of the output module 18, or for example laterally with respect to the motherboard 44, and further laterally with respect to the serial communications board 42.

In various embodiments however such as is shown in FIG. 4, the first and second portions and associated circuitry may instead be included on a single output module circuit board 38 having a given orientation either lateral or longitudinal with respect to the mother board 44 of the modular power supply 10 and within the scope of the present invention.

In such embodiments where the output modules 18 include one or both of the second and third connectors 26, 28, each output module 18 may thereby be configured for detachable coupling with the power supply 10 in any of a plurality of positions arranged in parallel with respect to the second end 16

Figure 5A:
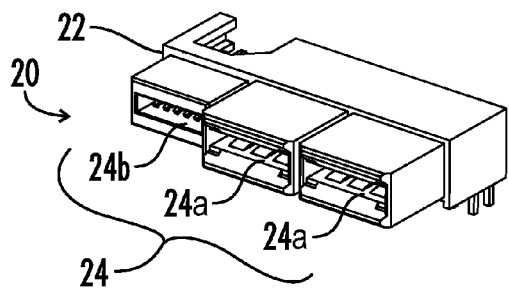
FIG. 5a is an isometric view of an embodiment of an output module connector housing for an output module in the modular power supply of FIG. 1.
Figure 5B:
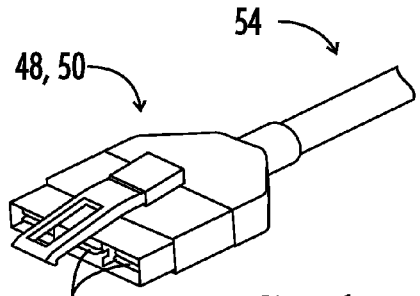
Figure 5C:
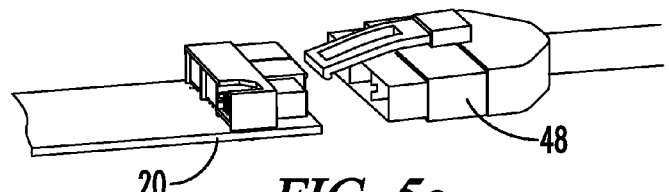
FIG. 5c is a combined view of the connector and cable of FIGS. 5a and 5b in a coupling arrangement.
Figure 6A:
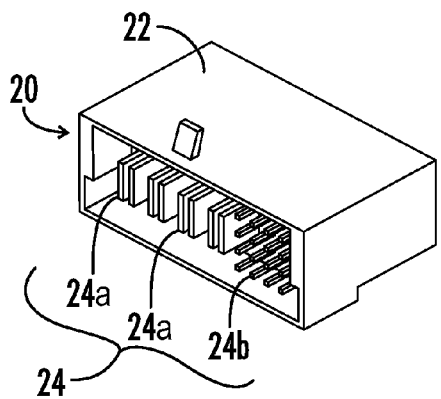
FIG. 6a is an isometric view of another embodiment of an output module connector housing for an output module in the modular power supply of FIG. 1.
Figure 6D:
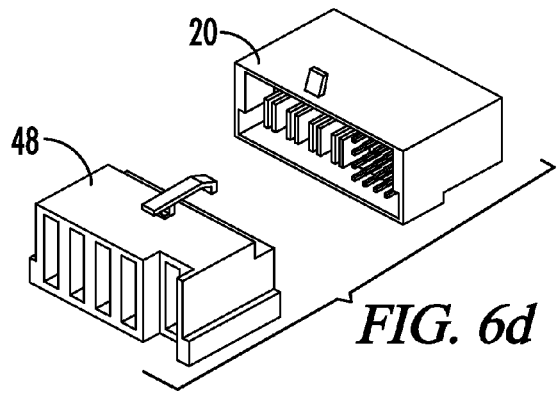
FIG. 6d is a combined view of the connector and cable housing of FIGS. 6a and 6b in a coupling arrangement.
Figure 6B:
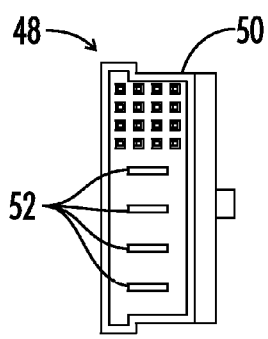
Figure 6C:
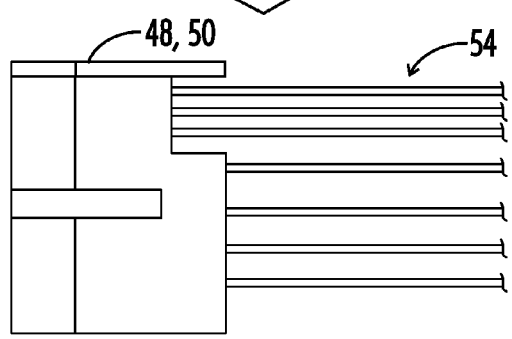
FIG. 6c is a side view of the cable of FIG. 6b.

Referring now to FIGS. 5a-c, the first connector 20 for a particular output module 18 may further include a housing 22 and a plurality of contact terminals 24 by which power and/or communications signals may be transmitted to or received from an external device (e.g., a load) coupled to the output module 18. In various embodiments where both power and communications signals are provided with respect to a common connector 20, it may be understood that the plurality of contact terminals 24 may further include a first set of contact terminals 24a suitable for power signals and a second set of contact terminals 24b suitable for communications signals. The distinction may be appropriate or required where for example a substantially lower tolerance for noise is associated with the communications signals and/or where a greater component rating is desired or necessary with respect to the contact terminals 24a for conducting power signals.

The load may be electrically coupled to the output module 18 via an external cable 54 and cable connector 48 also having a housing 50 and a plurality of contact terminals 52, with the housing 50 and contact terminals 52 of the external cable connector 48 being configured to mate with the housing 22 and contact terminals 24 of the first connector 20 of the output module 18. In various embodiments the contact terminals 24 of the first connector 16 may be male (e.g., plugs) which are configured to mate with female contact terminals 52 (e.g., sockets) of the external cable connector 48, as shown in FIGS. 5a, 5b, and 5c, but the opposite configuration may be used as well within the scope of the present invention.

The connectors 20, 48 as shown in FIGS. 5a-c generally are MOLEX-type connectors as previously known in the art. In various embodiments, alternative types and configurations of pluggable connectors may be used within the scope of the present invention. For example, with reference to FIGS. 6a-c, an embodiment of the output connector 20 and of the external cable connector 48 is shown using FCI-type connectors, also previously known in the art. The housings 22, 50 for the various connectors may generally be formed of molded plastic, with the contact terminals 24, 52 being formed of electrically conductive material such as copper or equivalent metallic composite or combination thereof, but various alternative materials and composites are well known for such uses in the art as well and may be understood as being anticipated within the scope of the invention.

Figure 7A:
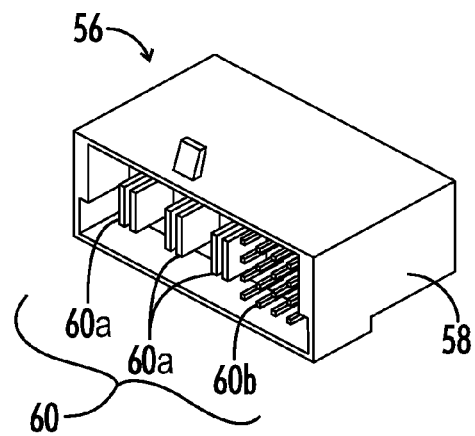
FIG. 7a is an isometric view of an embodiment of an input connector housing for the modular power supply of FIG. 1.
Figure 7B:
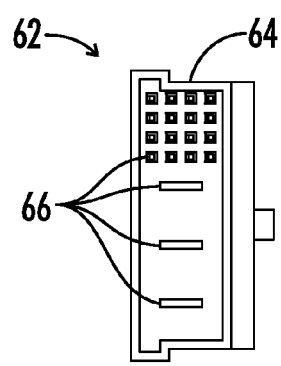
Figure 7C:
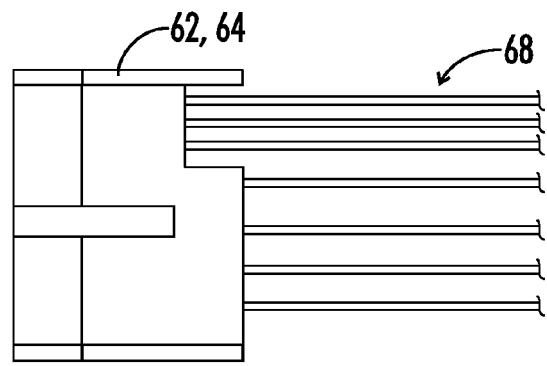
FIG. 7c is a side view of the cable of FIG. 7b.

Referring now to FIGS. 3 and 7a-c, the power supply 10 may further include a pluggable input connector 56 which is substantially similar in configuration to the output connectors 20 of the output modules 18, having a housing 58 and a plurality of contact terminals 60. In various embodiments where both power and communications signals are provided with respect to a common input connector 56, it may be understood that the plurality of contact terminals 60 may further include a first set of contact terminals 60a suitable for power signals and a second set of contact terminals 60b suitable for data communications signals. Input signals may be provided to the power supply 10 via, for example, an input power cable 68 having a connector 62 at a first end and with a housing 64 and a plurality of contact terminals 66 configured to mate with the contact terminals 60 of the input connector 56. In various embodiments the contact terminals 60 of the input connector 56 may be male (e.g., plugs) which are configured to mate with female contact terminals 66 (e.g., sockets) of the input power cable connector 62, as shown in FIGS. 7a, 7b, and 7c, but the opposite configuration may be used as well within the scope of the present invention.

Figure 8:
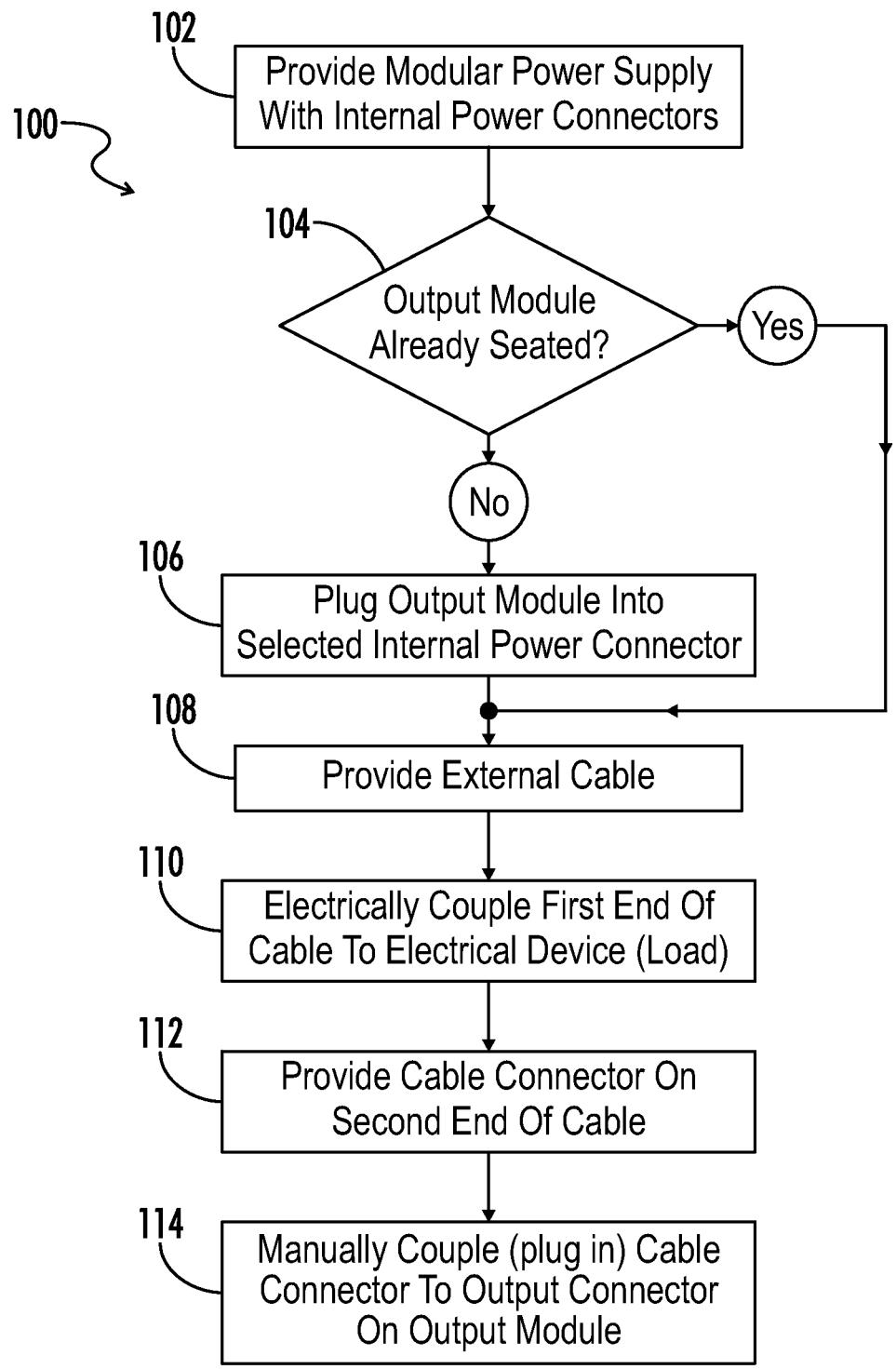
FIG. 8 is a flowchart showing a method of installing a modular power supply of the present invention.

Referring now to FIG. 8, an embodiment of a method 100 of installing a modular power supply 10 of the present invention may now be described.

In a first step 102, a modular power supply 10 is provided having a plurality of internal power connectors arranged within the power supply, and which may be collectively coupled to a common power bus configured to provide an intermediate bus power to each of the internal power connectors. In various embodiments each internal power connector may be associated with a communications connector further arranged within the power supply in parallel with the given power connector. The communications connectors in various embodiments may further be collectively coupled to a serial data bus arranged to provide data signals from a common controller such as, for example, a digital power manager.

One or more output modules may or may not (step 104) be provided as being detachably coupled to internal power connectors and any associated communications connectors within the power supply. In various embodiments each of the one or more output modules includes circuitry configured to convert power provided to the output module into a desired output power based on programmable control signals provided to the output module from the digital power manager via the serial data bus.

If an output module is not previously coupled to an internal power connector and (if available) an associated communications connector programmed for the desired power output to a given external device (e.g., load), in step 106 an output module which has been separately provided is detachably coupled to the appropriate internal connectors. The output module in various embodiments includes integral connectors having contact terminals which are configured to mate with contact terminals of the internal power connector and the communications connector. The appropriate internal connectors for a particular output module may be determined based on preexisting ratings for a particular power connector and control signals for the associated communications connector, or alternatively in various embodiments the output module may be seated in any available slot or equivalent parallel position relative to the end of the power supply, and the digital power manager may be subsequently programmable to control the power output of the output module for whichever internal connectors are associated with the selected position.

If an output module has been provided already coupled with the internal connector(s) of the power supply, the method may skip step 106 and continue with step 108, by providing an external cable. The external cable may be pre-fabricated and provided along with the power supply or fabricated at the location of the actual end electrical device or load.

The cable may in step 110 be electrically coupled at a first end to the load in accordance with the particular requirements of the load input, which may generally be outside of the scope of the present invention. For example, the load input may be a pluggable connector, a BUS BAR interconnection, a terminal strip, or the like, and the first end of the cable may therefore be provided or adjusted to suit the particular case.

In step 112 the cable may on a second end be provided with a cable connector having a housing and a plurality of contact terminals configured to mate with an output connector for any of the one or more output modules, the output connector also having a housing and a plurality of contact terminals. Consistent with the above description in step 108, the cable may be previously provided with a pre-fabricated connector compatible with the output connector on the output module, or may be fabricated proximate the end load.

In step 114, the external cable may be manually coupled to the output module, thereby coupling the external load to receive a desired power output from the modular power supply. The manual coupling is performed by simply plugging in the cable connector on the first end of the cable to the output connector on the selected output module, and requires no additional tools or other equipment from the end user performing the installation.

The previous detailed description has been provided for the purposes of illustration and description. Thus, although there have been described particular embodiments of the present invention of a new and useful "Modular Power Supply Interconnection System with Pluggable Interface," it is not intended that such references be construed as limitations upon the scope of this invention except as set forth in the following claims.

What is claimed is:

1. A switch-mode modular power supply comprising:
   an intermediate power converter;
   a serial communications control circuit;
   a first plurality of serial communications connectors coupled to the serial communications control circuit via a serial communications bus;
   a like plurality of power connectors coupled to the intermediate power converter via a power bus;
   a like plurality of output modules, each output module further comprising:
      a first pluggable connector having a housing and a plurality of pluggable contact terminals effective to provide output power from the output module to an external device via a cable connector configured to mate with the contact terminals of the first connector;
      a second pluggable connector having a housing and a plurality of pluggable contact terminals effective to receive input power from a corresponding power connector, the power connector being configured to mate with the contact terminals of the second connector;
      a third pluggable connector having a housing and a plurality of pluggable contact terminals effective to receive control signals from a corresponding serial communications connector, the serial communications connector being configured to mate with the contact terminals of the third connector; and
      a circuit board electrically coupled to each of the first, second and third connectors and further comprising circuitry effective to convert the received input power from the intermediate power converter into an output power determined according to the received control signals from the serial communications control circuit via the serial communications bus.

2. The modular power supply of claim 1, the input power to each output module being galvanically isolated with respect to any one or more additional output modules of the modular power supply and to the intermediate power converter via the power bus.

3. The modular power supply of claim 2, the control signals to each output module being galvanically isolated with respect to the serial communications control circuit via the serial communications bus.

4. The modular power supply of claim 1, the second connector configured to mate with any one of the plurality of power connectors of the modular power supply.

5. The modular power supply of claim 4, the third connector configured to mate with any one of the plurality of serial communications connectors of the modular power supply.

6. The modular power supply of claim 1, the pluggable contact terminals of each first connector associated with a particular output module configured to mate with contact terminals associated with an external cable providing for coupling said output module to an external load.

7. The modular power supply of claim 6, further comprising:
   a housing; and
   a motherboard residing within the housing, the intermediate power converter and the power bus further residing on the motherboard, the plurality of pluggable power connectors further integral with respect to the motherboard,
   wherein the second connector for each of the plurality of output modules is configured to mate with any one of the integral pluggable power connectors, the output module residing substantially within the housing when so mated.

8. The modular power supply of claim 7, the serial communications control circuit and the serial communications bus further residing on the motherboard, the plurality of pluggable serial communications connectors further integral with respect to the motherboard,
   wherein the third connector for each of the plurality of output modules is configured to mate with any one of the integral pluggable serial communications connectors.

9. The modular power supply of claim 7, further comprising:
   a digital control board residing within the housing, the serial communications control circuit and the serial communications bus further residing on the digital control board, the plurality of pluggable serial communications connectors further integral with respect to the digital control board,
   wherein the third connector for each of the plurality of output modules is configured to mate with any one of the integral pluggable serial communications connectors.

10. The modular power supply of claim 7, each first connector associated with a particular output module further comprising a plurality of contact terminals associated with providing output power and a plurality of contact terminals associated with providing and receiving communications signals.

11. The modular power supply of claim 1, the first connectors associated with each output module further comprising FCI-type connectors.

12. The modular power supply of claim 1, the first connectors associated with each output module further comprising MOLEX-type connectors.

* * * * *